(12) United States Patent
Kawanishi et al.

(10) Patent No.: US 9,040,123 B2
(45) Date of Patent: May 26, 2015

(54) PATTERN FORMATION METHOD

(71) Applicant: Kabushiki Kaisha Toshiba, Tokyo (JP)

(72) Inventors: Ayako Kawanishi, Kanagawa (JP); Tsukasa Azuma, Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/784,644

(22) Filed: Mar. 4, 2013

(65) Prior Publication Data
US 2014/0072722 A1 Mar. 13, 2014

(30) Foreign Application Priority Data
Sep. 10, 2012 (JP) ................ P2012-198653

(51) Int. Cl.
*B05D 5/00* (2006.01)
*C23C 16/00* (2006.01)
*G03F 7/00* (2006.01)

(52) U.S. Cl.
CPC . *B05D 5/00* (2013.01); *C23C 16/00* (2013.01); *G03F 7/00* (2013.01)

(58) Field of Classification Search
CPC .................................. B05D 5/00; G03F 7/00
USPC .................................................. 427/154, 532
See application file for complete search history.

(56) References Cited

U.S. PATENT DOCUMENTS

| 2008/0041818 | A1 | 2/2008 | Kihara et al. | |
| 2009/0191713 | A1 | 7/2009 | Yoon et al. | |
| 2009/0240001 | A1 | 9/2009 | Regner | |
| 2010/0297847 | A1 | 11/2010 | Cheng et al. | |
| 2011/0143095 | A1* | 6/2011 | Tada et al. | 428/156 |
| 2011/0281085 | A1* | 11/2011 | Tada et al. | 428/195.1 |
| 2012/0046415 | A1* | 2/2012 | Millward et al. | 525/105 |
| 2013/0189504 | A1 | 7/2013 | Nealey et al. | |

FOREIGN PATENT DOCUMENTS

| JP | 2003155365 A | 5/2003 |
| JP | 2008036491 A | 2/2008 |
| JP | 2010053263 A | 3/2010 |
| JP | 20100269304 A | 12/2010 |

OTHER PUBLICATIONS

E. W. Edwards et al.;"Precise Control over Molecular Dimensions of Block-Copolymer Domains Using the Interfacial Energy of Chemically Nanopatterned Substrates", Advanced Materials; Aug. 4, 2004; pp. 1315-1319; vol. 16.

(Continued)

*Primary Examiner* — Elena T Lightfoot
(74) *Attorney, Agent, or Firm* — Patterson & Sheridan LLP

(57) ABSTRACT

According to the embodiments, a pattern formation method includes a process of formation of a self-assembly material layer containing at least a first segment and a second segment on a substrate having a guide layer, a process of formation of a neutralization coating on the self-assembly material layer, and a process of formation of a self-assembly pattern including a first region containing the first segment and a second region containing the second segment following phase separation of the self-assembly material layer.

12 Claims, 8 Drawing Sheets

(56) References Cited

OTHER PUBLICATIONS

The University of Texas at Austin, Department of Chemistry, Department of Chemical Engineering; "Block Copolymer Orientation Control Using a Top-Coat Surface Treatment"; Journal of Photopolymer Science and Technology; 2012; pp. 125-130; vol. 25—No. 1.

Office Action mailed Jan. 30, 2015, filed in corresponding Japanese Patent Application No. 2012-198653, with English translation.

* cited by examiner

PATTERN FORMATION METHOD

CROSS-REFERENCE TO RELATED APPLICATION

This application is based upon and claims the benefit of priority from Japanese Patent Application No. 2012-198653, filed Sep. 10, 2012, the entire contents of which are incorporated herein by reference.

FIELD

Embodiments described herein relate generally to a pattern formation method.

BACKGROUND

Conventional photolithography technology used during semiconductor fabrication includes a double patterning technology by ArF liquid immersion exposure, EUV lithography and nanoimprint lithography. Conventional photolithography technology, however, has some drawbacks, such as higher production costs, a decrease in throughput, continued further miniaturization of the pattern, among other challenges.

Under such a situation, it is expected that directed self-assembly (DSA) may be applied to lithography technology. DSA can form a pattern having higher dimensional accuracy because it occurs by a spontaneous action of energy stabilization. Additionally, the technology utilizing microphase separation of a high-molecular block copolymer can form a periodic structure having various shapes, ranging in size from several nanometers to several hundred nanometers, by implementation of simple coating and annealing. Spherical, cylindrical, or lamella-shaped formations can be obtained by altering the composition ratio of the high-molecular block copolymer; and various sizes of a dot pattern, a hole or pillar pattern, or a line pattern, and so on, can be formed by altering those sizes according to molecular weight.

A form, within which, the polymer phase formed by self-assembly occurs, is required for a broad and intended formation using DSA. As a form, a physical guide (grapho-epitaxy), which facilitates a microphase separation pattern at a depressed region of a pattern having projected portions adjacent the depressed regions, and a chemical guide (chemical-epitaxy), which controls the forming position of microphase separation based on the difference in surface energy underneath the DSA material, are known.

When forming a microphase separation by using such a guide and coating a self-assembly material on a base coating having adjusted interfacial energy, the self-assembly material is phase separated periodically (regularly) due to the effect of interfacial energy near the base coating; alternately, the self-assembly material is not phase separated periodically (regularly) because there is minimal effect of interfacial energy around the area spaced-away from the base coating. This is because periodical phase separation is in a metastable state and the self-assembly material will perform random phase separation that is at its most stable state without additional energy from outside. Therefore, conventionally, the thickness of the self-assembly material is decreased so that the effect of interfacial energy of the base coating is realized entirely when forming a periodical microphase separation pattern. However, the problem of a microphase separation pattern having such small thickness is that it lacked sufficient robustness of fabrication.

DETAILED DESCRIPTION

The embodiments provide a pattern formation method that enables regular phase separation of the self-assembly material with a large thickness.

In general, the embodiments of the present invention are described based on the drawings shown in the figures.

The present embodiment of a pattern formation method includes a step of forming a self-assembly material layer containing at least a first segment and a second segment on a substrate having a guide layer, a step of forming a neutralization coating on the self-assembly material layer, and a step of self-assembling pattern formation including a first region of the pattern containing the first segment and a second region of the pattern containing the second segment following phase separation of the self-assembly material layer.

First Embodiment

A pattern formation method of the first embodiment is described using FIG. 1 to FIG. 10.

Figure 1:
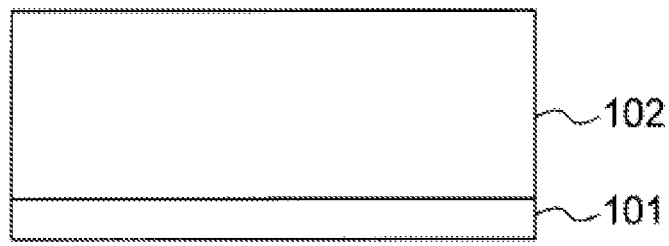
FIG. 1 is a cross-sectional diagram illustrating a pattern formation method of a first embodiment wherein a $SiO_2$ layer to be patterned is deposited over a substrate.

First, as illustrated in FIG. 1, a $SiO_2$ coating with a thickness of 100 nm is formed by CVD, for example, on a substrate 101 to form a workpiece coating 102.

Figure 2:
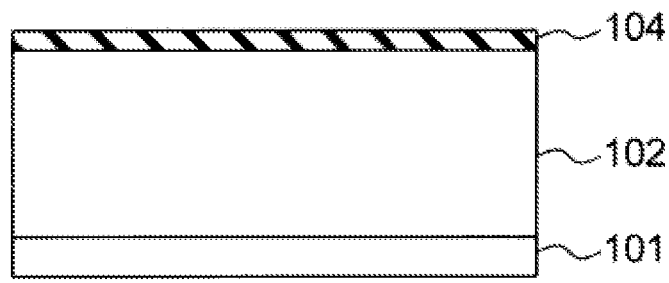
FIG. 2 is a cross-sectional diagram showing a neutralization layer formed over the a $SiO_2$ layer of the substrate of FIG. 1.

Second, as illustrated in FIG. 2, a neutralization coating 104 is formed on the workpiece coating 102. For example, on the workpiece coating 102, one can spin-coat polyethylene glycol monomethyl ether acetate (PGMEA) solution containing 1.0 wt % of random copolymer (PS-r-PMMA) of polystyrene (PS) and polymethylmethacrylate (PMMA) at 1,500 rpm and followed by baking at 110° C. for 90 seconds and 240° C. for 3 minutes on a hot plate to form the neutralization coating 104.

Figure 3:
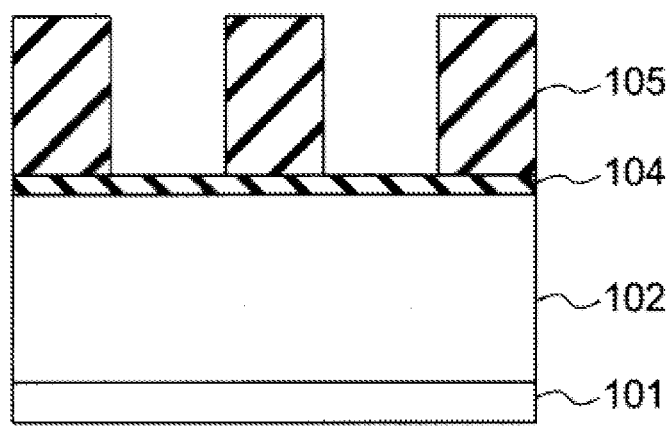
FIG. 3 is a cross-sectional diagram showing a patterned resist layer formed over the neutralization layer of the substrate of FIG. 2.

Next, as illustrated in FIG. 3, a resist 105 with a thickness of 100 nm is spin-coated onto the neutralization layer 104, an ArF excimer laser is used to expose and develop it, and then a line and space pattern that is 45-nm wide is formed therein.

Figure 4:
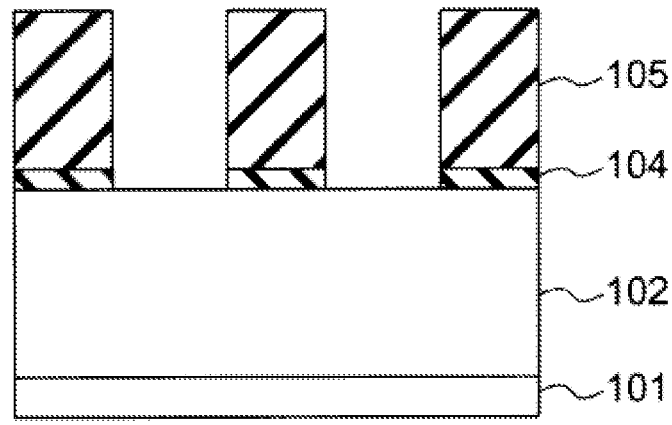
FIG. 4 is a cross-sectional diagram of the substrate of FIG. 3 wherein the neutralization layer has been pattern etched using the patterned resist shown in FIG. 3.

Next, as illustrated in FIG. 4, using the resist 105 as a mask, the neutralization coating 104 is etched through using reactive ion etching (RIE) with an oxygen plasma. This step transfers the resist pattern to the neutralization coating.

Figure 5:
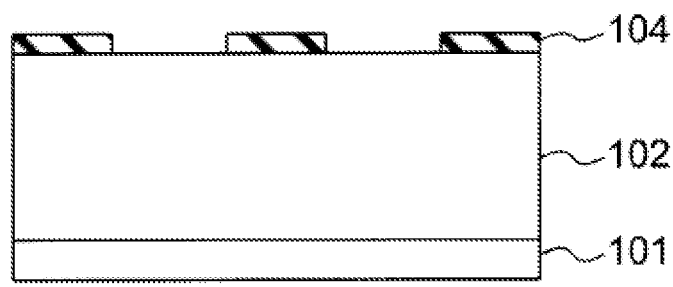
FIG. 5 is a cross-sectional diagram of the substrate of FIG. 4 with the resist stripped therefrom.

Next, as illustrated in FIG. 5, the resist 105 is stripped from the patterned neutralization coating 104. A foundation layer including a portion of the neutralization coating 104 and a portion of the workpiece coating 102 is thus formed at this step. The foundation layer functions as a chemical guide layer that controls the formation position of the microphase separation pattern when a block polymer, which is formed in a later step, causes microphase separation.

The foundation layer includes a portion in which interfacial tensions between the self-assembly material (including the first segment and the second segment) and first and second segments are equal. The foundation layer also contains a portion in which interfacial tensions between the self-assembly material and the first and second segments are not equal. In other words, the upper surface of the foundation layer (the chemical guide layer) has neutral (non-preferential) surface for polystyrene (PS) and polymethylmethacrylate (PMMA).

Figure 6:
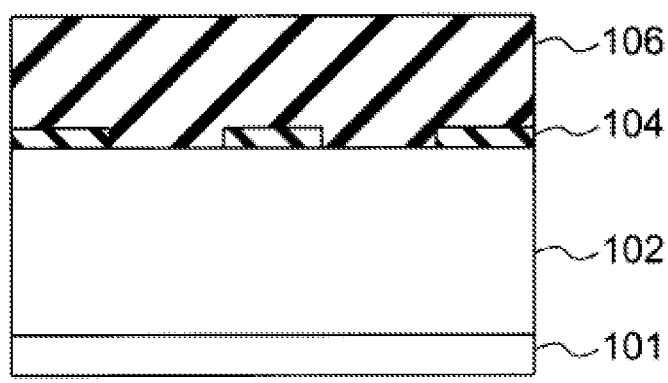
FIG. 6 is a cross-sectional diagram of the substrate of FIG. 5 showing the block polymer layer formed over the patterned neutralization layer of FIG. 5.

Next, as illustrated in FIG. 6, a block polymer layer 106 is formed by coating a block polymer onto the foundation layer. For example, a diblock copolymer, which includes a first polymer block chain (first segment) mixed with a second polymer block chain (second segment), is used as a block polymer for coating. As a diblock copolymer, for example, block copolymer of polystyrene (PS) and polymethylmethacrylate (PMMA) can be used. For example, the PGMEA solution containing 1.0 wt % of the diblock copolymer at 1,500 rpm can be spin-coated on the foundation layer.

The block polymer layer 106 formed here shall be thick enough so that the whole block polymer layer 106 will not be phase separated periodically (regularly) only by the effect of interfacial energy of the foundation layer.

Figure 7:
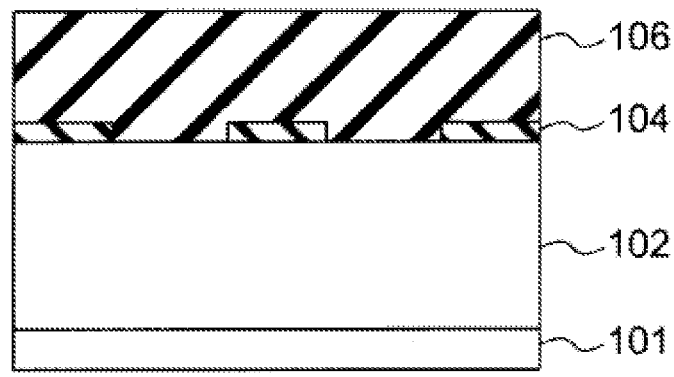
FIG. 7 is a cross-sectional diagram of the substrate of FIG. 6.

Next, as illustrated in FIG. 7, the substrate 101 is baked at 110° C. for 60 seconds on a hot plate.

Figure 8:
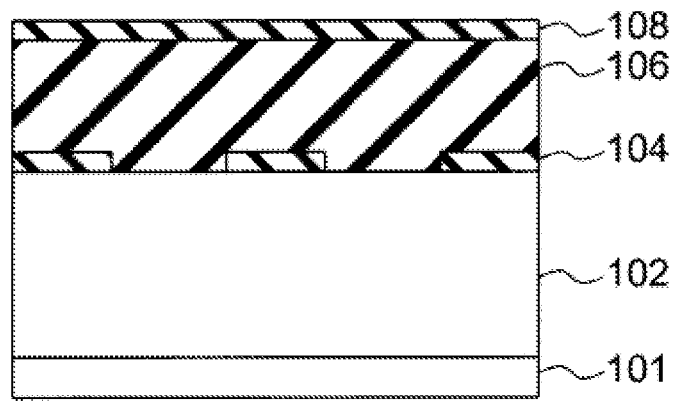
FIG. 8 is a cross-sectional diagram of the substrate of FIG. 7 showing a neutralization coating formed over the baked block polymer layer thereof.

Then, as illustrated in FIG. 8, a neutralization coating 108 is formed on the block polymer layer 106. In the neutralization coating 108, interfacial tension between the neutralization coating 108 and the first segment of the block polymer (in the block polymer layer 106) is equal to the interfacial tension between the neutralization coating 108 and the second segment of the block polymer. For example, the neutralization coating 108 can be formed by turning the upper surface region of the block polymer layer 106 into the neutralization coating by a surface treatment of the block polymer layer 106 using a solution in which interfacial tension between the solution and the first segment of block polymer is equal to the interfacial tension between that and the second segment. A material identical to the neutralization coating 104 can be used for the formation of the neutralization coating 108. Contamination of the block polymer layer 106 and the neutralization coating 108 can be prevented because of the improvement in solvent resistance of the block polymer layer 106 due to the heat treatment in the step illustrated in FIG. 7.

Figure 9:
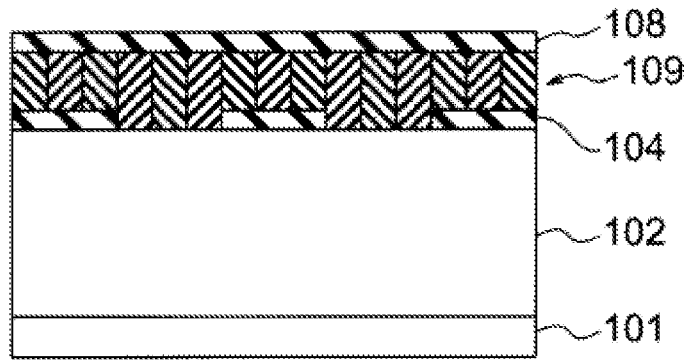
FIG. 9 is a cross-sectional diagram of the substrate of FIG. 8 showing the formation of alternating self assembled first and second polymer regions after baking the substrate of FIG. 8.

Next, as illustrated in FIG. 9, baking at 110° C. occurs for 90 seconds, after which baking proceeds at 220° C. for 3 minutes under nitrogen atmosphere. Then, a self-assembly pattern 109 is formed by microphase separation at the top of block polymer layer 106. This separation creates alternating first and second polymer regions across the face of the foundation layer. The top of block polymer layer 106 is not exposed to the air since the top surface is covered with neutralization coating 108; the resulting self-assembled pattern 109 turns into a lamella-shape microphase separation pattern.

Figure 10:
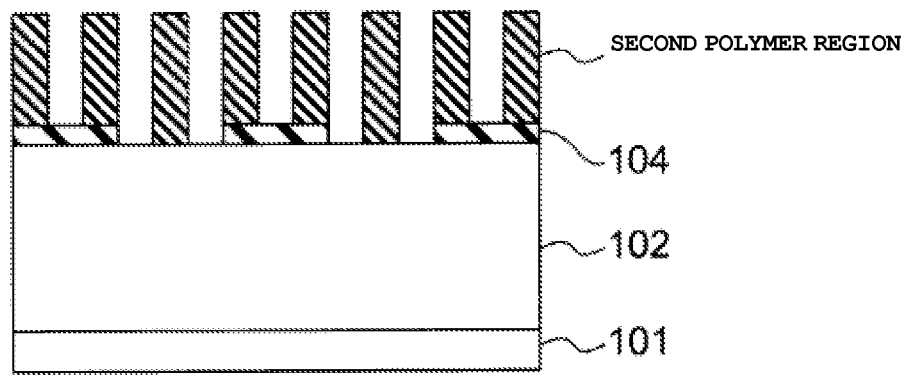
FIG. 10 is a cross-sectional diagram of the substrate of FIG. 9, after development of one of the alternating self assembled polymer regions to form a mask pattern on the $SiO_2$ layer of FIG. 9.

Subsequently, as illustrated in FIG. 10, the neutralization coating 108 is removed such as by stripping thereof chemically. Then, by selectively removing the first or the second polymer regions, such as by using a chemical solvent or etchant to selectively remove on or the other material, a line and space pattern having a high aspect ratio and a smaller feature size than obtained using conventional photolithography is obtained. Using the resulting patterned polymer, the underlying workpiece coating 102 is patterned using this pattern as a mask.

In conclusion, in the present embodiment, regular phase separation of a self-assembly material having large thickness can be implemented by forming the neutralization coating 108 on the block polymer layer 106 and regulating interfacial tension at the top surface of the block polymer layer 106. In addition, enhanced robustness of fabrication can be obtained due to the greater thickness of self-assembly material as described herein. This large thickness of the self-assembly material has been difficult to obtain conventionally.

In the first embodiment, since an organic solvent is used as a solvent to form the neutralization coating 108, the heat treatment for the improvement in solvent resistance of the block polymer layer 106 is performed before the formation of the neutralization coating 108. This is done to not contaminate the block polymer layer 106 with solvent. If other procedures are available, the heat treatment can be skipped to avoid contamination, such as using a solvent that is a poor solvent for the self-assembly material, to form the neutralization coating 108. For example, distinct solvents may be used as a solvent for the formation of the block polymer layer 106 and a solvent as the formation of the neutralization coating 108. In addition, a coating formed on top of the block polymer layer 106 can be formed through use of an aqueous solution or a foam if it has the characteristics or function of a neutralization coating.

Second Embodiment

In this embodiment, the pattern formation method is identical to that described in the first embodiment (ref. FIG. 1 to FIG. 6) until the step of the formation of the block polymer layer 106 on top of the ground coating layer including the neutralization coating 104 and the workpiece coating 102. The identical elements of the pattern formation method of the first embodiment will not be explained again in the second embodiment.

Figure 11:
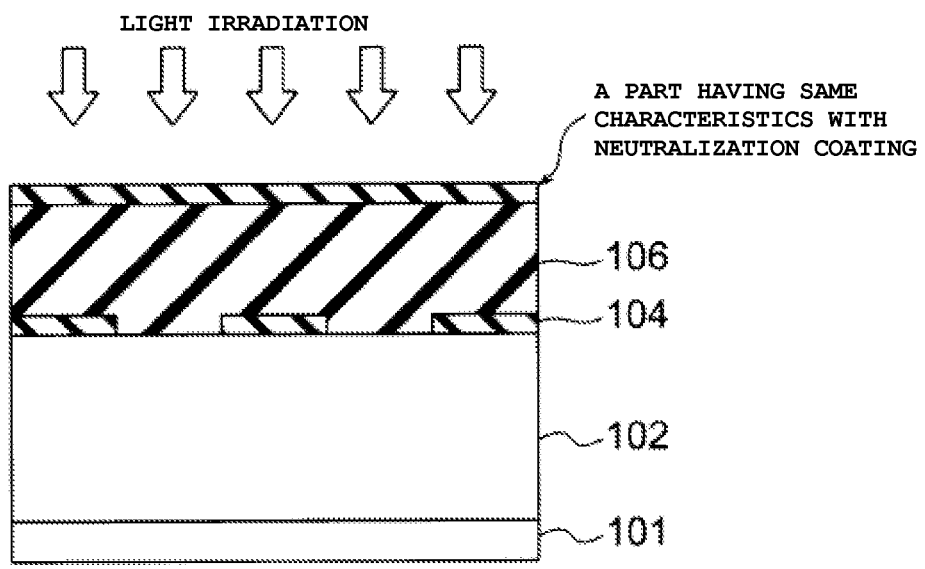
FIG. 11 is a cross-sectional diagram illustrating a pattern formation method of a second embodiment, wherein a substrate having a patterned neutralization layer, a block polymer layer, and an overlying layer having neutralization characteristics is formed on the $SiO_2$ of the substrate and irradiated.

As illustrated in FIG. 11, a bond of PS-b-PMMA is broken by selective light irradiation only to the top surface of the block polymer layer 106. At the area in which the covalent bonding is broken, the block polymer layer 106 becomes a homopolymer, the block copolymer having various molecular weights or the random copolymer acquires characteristics similar to those of the neutralization coating.

Figure 12:
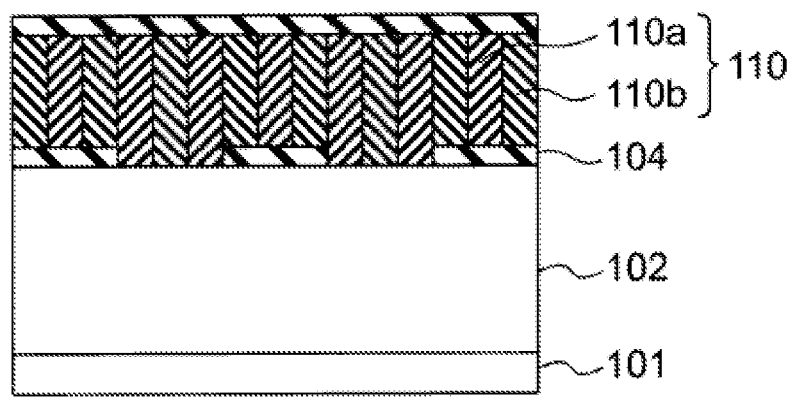
FIG. 12 is a cross-sectional diagram of the substrate of FIG. 11 showing the formation of self assembled alternating regions of first and second polymer.

Next, as illustrated in FIG. 12, baking occurs at 110° C. for 90 seconds, after which baking proceeds at 220° C. for 3 minutes under nitrogen atmosphere; then, a self-assembly pattern 110 is formed by microphase separation at the block polymer layer 106. The self-assembly pattern 110 is lamella-shaped having alternately placed a laminar first polymer region 110a containing the first polymer block chain and a laminar second polymer region 110b containing the second polymer block chain. The lower part of block polymer layer 106 obtains a lamella-shaped self-assembly pattern due to the effect of interfacial energy from the ground coating layer. In addition, the upper part of the block polymer layer 106 is not exposed to the air and obtains a lamella-shaped self-assembly pattern, since the surface region of the block polymer 106 is made to have the same characteristics as the neutralization coating.

Figure 13:
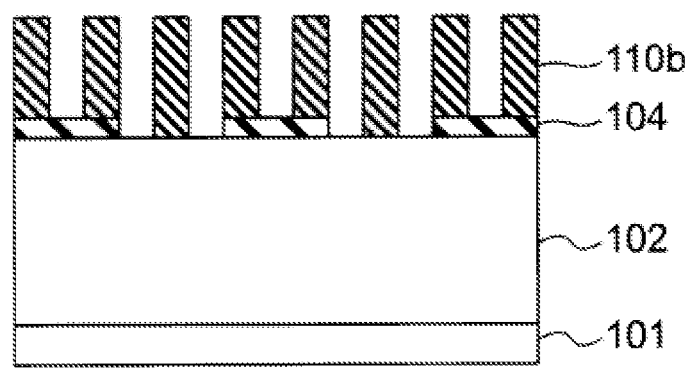
FIG. 13 is a cross-sectional diagram of the substrate of FIG. 12 wherein one of the two alternating regions of polymer is removed to form a mask on the underlying patterned neutralization and $SiO_2$ layers.

Next, as illustrated in FIG. 13, the regions where the bond of PS-b-PMMA is broken is removed. The line and space pattern having a high aspect ratio and smaller feature size than created using conventional photolithographic techniques can be obtained by selectively removing either one the first polymer region (first polymer region 110a including PMMA, for example) or the second polymer region through the development step where a chemical solvent or etchant is used to selectively remove on or the other material. After that, the workpiece coating 102 is fabricated using this pattern as a mask.

Thus, the self-assembly material having a larger thickness can be phase separated regularly through turning the top part of the block polymer layer 106 into the material having the same characteristics as the neutralization coating by light irradiation. Sufficient robustness of fabrication can be obtained due to the larger thickness of the self-assembly material.

In the second embodiment, the top part of the block polymer layer 106 is turned into the material having the same characteristics as the neutralization coating by light irradiation; however, instead of light irradiation, a wet treatment can be applied. The surface of the block polymer layer 106 is processed by the surface treatment, and the top part acquires the same characteristics as the neutralization coating.

Third Embodiment

A pattern formation method of the third embodiment is described using FIG. 14 to FIG. 19.

Figure 14:
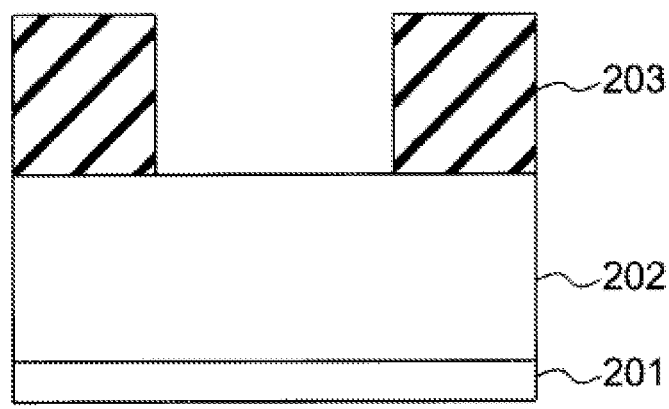
FIG. 14 is a cross-sectional diagram illustrating a pattern formation method of a third embodiment wherein a substrate includes a $SiO_2$ layer and a patterned resist formed over the $SiO_2$ layer.

First, as illustrated in FIG. 14, a SiO₂ coating with a thickness of 100 nm is formed by CVD, for example, on a substrate 201 to form a workpiece coating 202, after which a resist 203 with a thickness of 100 nm is spin-coated, an ArF excimer laser is used to expose and develop it, and then the line and space pattern with 150 nm half pitch is formed. FIG. 14 illustrates a part of the line and space pattern. This line and space pattern functions as a physical guide layer that controls the formation position of the microphase separation pattern when the block polymer formed in later step causes microphase separation.

Figure 15:
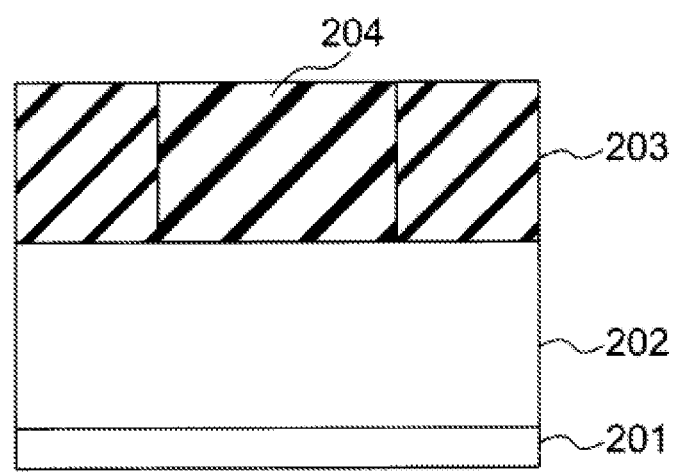
FIG. 15 is a cross-sectional diagram of the substrate of FIG. 14 wherein a block polymer is disposed in the patterned recesses of the patterned resist layer.

Then, as illustrated in FIG. 15, a block polymer layer 204 is formed at depressed removed region of the resist pattern 203. For example, one can spin-coat a polyethylene glycol monomethyl ether acetate (PGMEA) solution containing 2.0 wt % of block copolymer (PS-b-PMMA) of polystyrene (PS) and polymethylmethacrylate (PMMA) at 1,500 rpm and then form the block polymer layer 204.

Figure 16:
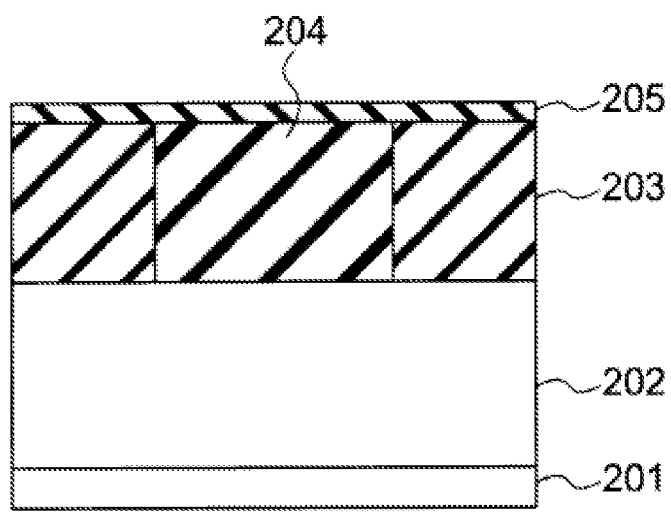
FIG. 16 is a cross-sectional diagram of the substrate of FIG. 15 showing a neutralization coating layer overlying the patterned resist and block polymer.

Next, as illustrated in FIG. 16, a neutralization coating 205 is formed on the resist pattern 203 and block polymer layer 204. The neutralization coating 205 is, for example, a solidified polyethylene glycol monomethyl ether acetate (PGMEA) solution containing 1.0 wt % of random copolymer (PS-r-PMMA) of polystyrene (PS) and polymethylmethacrylate (PMMA) in a film shape.

Figure 17:
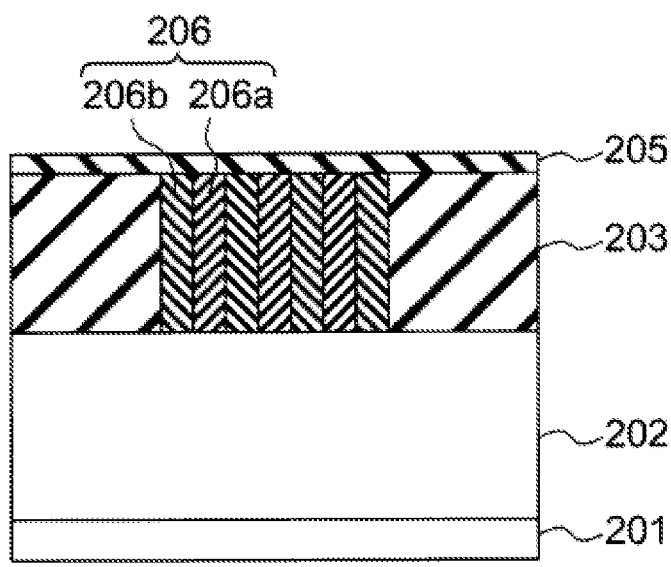
FIG. 17 is a cross-sectional diagram of the substrate of FIG. 16 showing the formation of self assembled alternating regions of first and second polymer in the recesses of the patterned resist.

Then, as illustrated in FIG. 17, the substrate 201 is baked at 110° C. for 90 seconds on a hot plate, after which it is baked further at 220° C. for 3 minutes under a nitrogen atmosphere. The block polymer layer 204 then forms a lamella-shaped self-assembly pattern 206 having alternately placed a laminar first polymer region 206a containing first polymer block chain and a laminar second polymer region 206b containing the second polymer block chain. For example, the lamella-shaped self-assembly pattern 206 is formed with 15 nm half pitch.

The top of block polymer layer 204 is not exposed to the air since the top surface is covered with the neutralization coating 205; thus, the whole block polymer layer 204 takes one lamella-shaped self-assembly pattern 206.

Figure 18:
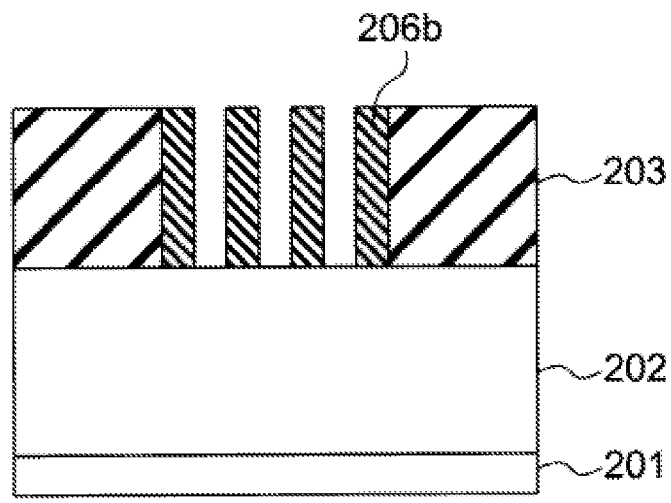
FIG. 18 is a cross-sectional diagram of the substrate of FIG. 17 wherein the neutralization layer, and one of the two regions of polymer, have been removed.

Next, as illustrated in FIG. 18, the neutralization coating 205 is removed. The line and space pattern having a higher aspect ratio can be obtained by selectively removing either the first polymer region 206a (first polymer region 206a including PMMA for example) or the second polymer region 206b through the development step wherein a solvent selective to one or the other polymer region is used to dissolve one of the polymers.

Figure 19:
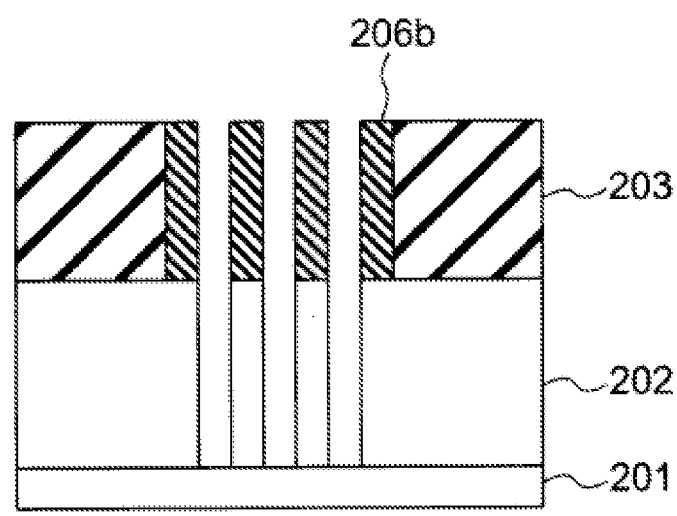
FIG. 19 is a cross-sectional diagram of the substrate of FIG. 18 wherein the $SiO_2$ layer has been pattern etched using the remaining block polymer region as a mask.

After that, as illustrated in FIG. 19, the workpiece 202 is patterned using either one of the remaining first polymer region 206a or second polymer region 206b (second polymer region 206b including PS for example) and resist 203 as a mask.

Thus, in the present embodiment, regular phase separation of an entire self-assembly material having a larger thickness is enabled by forming the neutralization coating 205 on the block polymer layer 204 following the formation of block polymer layer 204 within a physical guide and performing microphase separation of the block polymer layer 204. Sufficient robustness of fabrication can be obtained due to the larger thickness of self-assembly material.

In the third embodiment, exposure and development using ArF excimer laser is used to form a resist pattern as a physical guide; however, ArF liquid immersion exposure, optical lithography such as EUV and nanoimprint lithography can be utilized to form the physical guide. In addition, the surface treatment can be applied to the physical guide as necessary.

In the first to third embodiments, the lamella-shaped self-assembly material is formed by microphase separation of the block polymer layer, however other shapes such as a cylinder shape of self-assembly pattern can also be formed.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern formation method, comprising:
   forming a guide layer on a substrate;
   forming a self-assembly material layer containing at least a first segment and a second segment on the guide layer;
   forming a neutralization coating on an upper surface of the self-assembly material layer by exposing the upper surface of the self-assembly material layer to a poor solvent for the self-assembly material layer; and
   forming a self-assembled pattern containing a first region comprising the first segment and a second region comprising the second segment after phase separation of the self-assembly material layer.

2. The method of claim 1, wherein the neutralization coating protects the self-assembly material from air during formation of the self-assembled pattern.

3. The method of claim 1, wherein the self-assembly material layer is formed from a solution, and a solvent used in the formation of the solution is different than the solvent used to form the neutralization coating.

4. The method of claim 1, wherein an upper surface of the guide layer has neutral surface for the first segment and the second segment.

5. The method of claim 4, wherein the self-assembly material layer is formed from a solution, and a solvent used in the formation of the solution is different than the solvent used to form the neutralization coating.

6. The method of claim 1, wherein the guide layer comprises a plurality of depressions and a plurality of projections.

7. The method of claim 1, wherein the guide layer comprises a first pattern area and a second pattern area, wherein, in the first pattern area, interfacial tension between the guide layer and the first segment is equal to the interfacial tension between the guide layer and the second segment.

8. The method of claim 7, wherein, an upper surface of the guide layer has neutral surface for the first segment and the second segment.

9. A pattern formation method, comprising
   forming a self-assembly material layer containing at least a first segment and a second segment on a substrate having a guide layer;
   forming a neutralization coating on an upper surface of the self-assembly material layer by exposing the upper surface of the self-assembly material layer to a poor solvent for the self-assembly material layer; and
   forming a pattern on the self-assembly material layer, the pattern comprising a first region including the first segment and a second region including the second segment when the self-assembly material layer is phase separated.

10. The method of claim 9, wherein the guide layer comprises a plurality of depressions and a plurality of projections.

11. The method of claim 9, wherein an upper surface of the guide layer has neutral surface for the first segment and the second segment.

12. The method of claim 7, wherein in the second pattern area, interfacial tension between the guide layer and the first segment is not equal to the interfacial tension between the guide layer and the second segment.

* * * * *